United States Patent [19]

Hartemann

[11] 4,013,983
[45] Mar. 22, 1977

[54] SURFACE WAVE ELECTRO-MECHANICAL DEVICE

[75] Inventor: Pierre Hartemann, Paris, France
[73] Assignee: Thomson-CSF, Paris, France
[22] Filed: Nov. 7, 1975
[21] Appl. No.: 629,963
[30] Foreign Application Priority Data
Nov. 8, 1974 France .............................. 74.37075
[52] U.S. Cl. ................................ 333/72; 310/8.2; 333/30 R
[51] Int. Cl.² ..................... H03H 9/04; H03H 9/26; H03H 9/32; H03H 9/30
[58] Field of Search ..................... 333/30 R, 72, 71; 310/8, 8.1, 8.2, 9.8; 331/107 A

[56] References Cited
UNITED STATES PATENTS

| | | | |
|---|---|---|---|
| 3,781,717 | 12/1973 | Kuenemund | 333/6 |
| 3,882,430 | 5/1975 | Maerfeld | 333/30 R |
| 3,883,831 | 5/1975 | Williamson et al. | 333/72 X |
| 3,886,504 | 5/1975 | Hartmann et al. | 333/72 |

OTHER PUBLICATIONS

Barrekette et al. — "Multichannel Guide for ASW Memories" in IBM Technical Disclosure Bulletin vol. 14, No. 4 Sept. 1971; pp. 1295–1298.

*Primary Examiner*—Alfred E. Smith
*Assistant Examiner*—Marvin Nussbaum
*Attorney, Agent, or Firm*—Cushman, Darby & Cushman

[57] ABSTRACT

The invention relates to elastic surface wave resonators and filters. The device in accordance with the invention is based mainly on the selective reflection of the elastic surface waves. It comprises a crystalline substrate in the upper face of which at least one grating of reflective elements is formed by ion implantation for locally altering the regular arrangement of the atoms in the lattice structure of the substrate.

12 Claims, 8 Drawing Figures

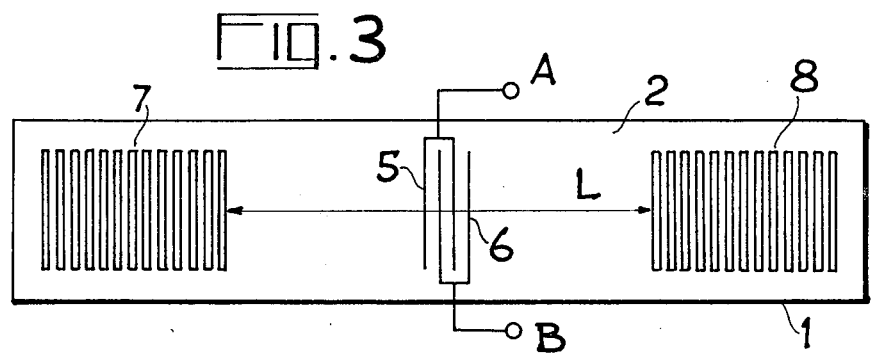
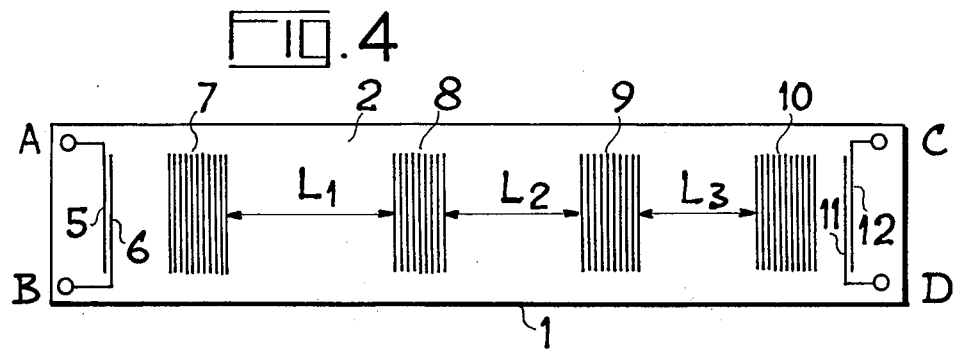
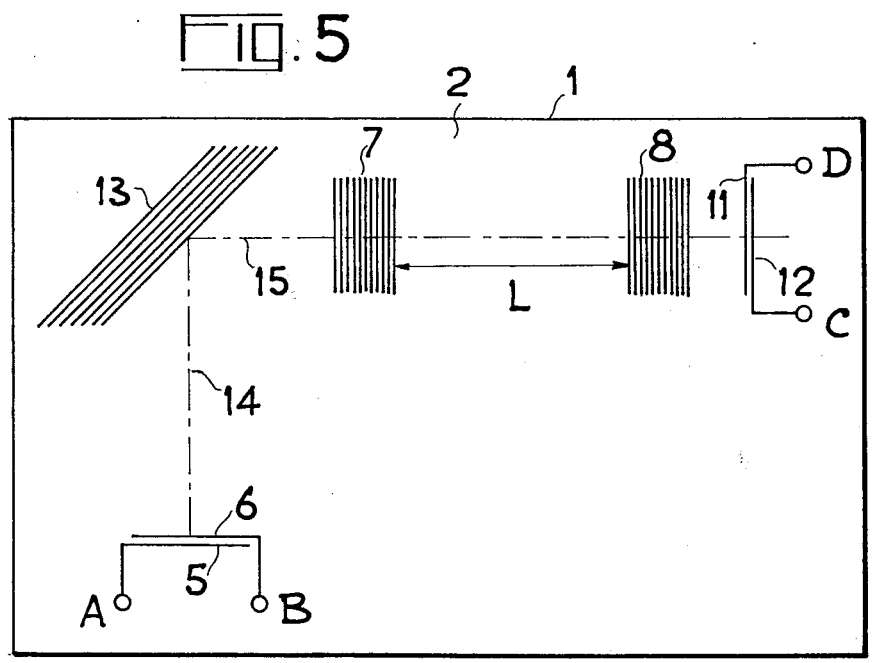

SURFACE WAVE ELECTRO-MECHANICAL DEVICE

The present invention relates to surface wave electro-mechanical devices utilisable as resonators or filters.

It is known to manufacture bulk wave, electro-mechanical filters and resonators the characteristics of which are essentially a function of the thickness of an elastic plate within which the bulk waves are excited by piezoelectrical effect. A well known example of an electro-mechanical bulk wave resonator comprises the conventional mounting of a quartz plate having parallel faces, between two electrodes.

It is a disadvantage of bulk wave transducers that they necessitate precise thickness dimensioning of the plate acting as substrate. The sheets plates, cut ground to a small thickness, are fragile and it is necessary in these devices to provide electrodes on the two major faces.

These disadvantages justify the fact that, in the field of electro-mechanical filters, it has been found to be necessary to produce devices implementing surface wave propagation. These devices are, in fact, more robust and simpler to manufacture. In this connection, mention may be made of surface wave electro-mechanical filters utilising transducers in the form of electrically conductive combs in interdigital arrangement. It is known that the transfer function of these filters is a function of the shape of the combs, inasmuch as the height and spacing of the teeth thereof may be non-uniform.

Subjecting the surface waves emitted by a transducer to one or more selective reflections, it is possible to produce interferential filters and resonators capable of completing the existing range of surface wave devices.

In accordance with the present invention there is provided a surface wave electro-mechanical device comprising a crystalline substrate having a face for propagating surface wave vibratory energy, and surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electro-mechanical transducer, and separated from one another by a half wavelenght.

For a better understanding of the invention, and to show how the same may be carried into effect, reference will be made to the ensuing description and to the accompanying FIGS., among which:

FIG. 3 shows a cavity resonator;

FIG. 4 show a band pass filter having resonant cavities which are frequency staggered;

FIG. 5 shows a filter comprising a resonant cavity associated with a frequency selective resonator;

Figure 1:
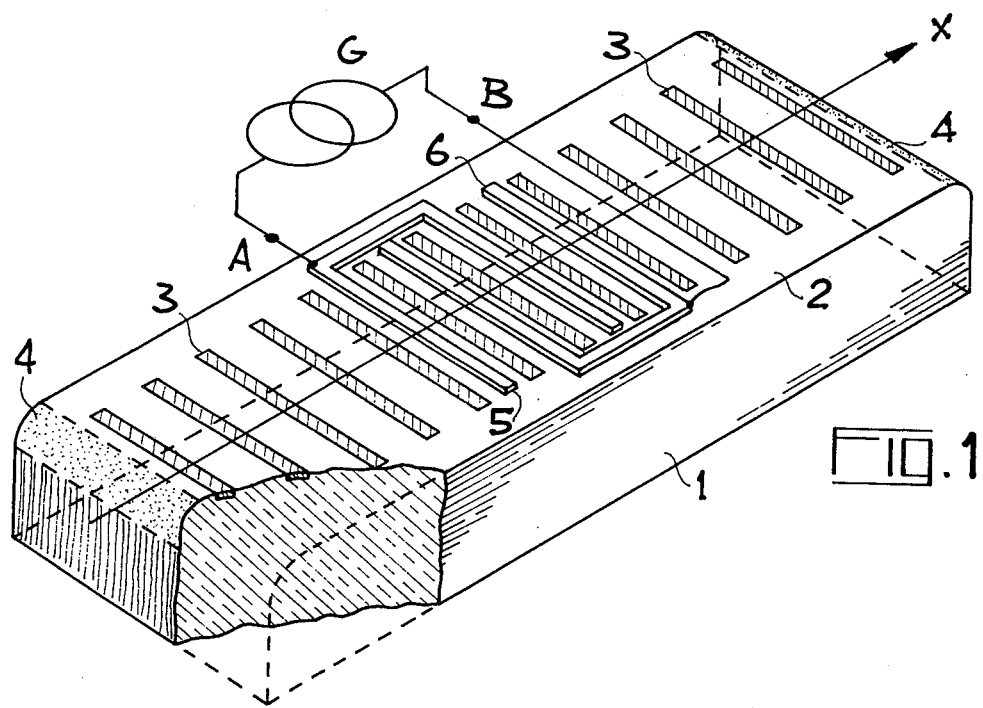
FIG. 1 shows a selective reflection resonator device.

FIG. 1 shows a resonator electro-mechanical device of the surface wave type comprising a elastic substrate 1 at the surface 2 of which there has been provided an electro-mechanical transducer 5, 6 capable of bilaterally radiating vibratory energy in the form of surface waves. FIG. 1 shows the electro-mechanical transducer in the form of two electrically conductive combs in interdigital arrangement 5 and 6. In this case, the substrate 1 is cut from a piezo-electric material and, by way of non-limitative example, it comprises a monocrystalline quartz plate the edges 4 of which are cut by a sand jet for showing roughness so as, by seattering, to prevent specular wave reflections at the two ends of the wave guide surface 2. It is well known that such a transducer, connected at its terminals A and B to an alternating electrical generator G is capable of emitting, in the positive and negative direction of the axis X, elastic surface waves such as Rayleigh waves. When the waves are freely propagated at the surface 2 of the substrate, the transmission band is relatively wide and is centred on a frequency for which the spacing of two consecutive comb teeth is equal to half the wavelength of the elastic surface waves propagated along the surface 2. This is true only if the propagation characteristics of the surface 2 are uniform throughout the extent of the latter. Under these conditions, it is in fact found that the electrical impedance of the transducer varies relatively little in the pass-band.

The device of FIG. 1 may function as a resonator. For this purpose, the invention provides the setting up of a periodic disturbance of the propagation characteristics along the surface 2 of the substrate. This periodic disturbance is created by associating with the surface 2 a grating of reflective elements 3 which, in a typical embodiment, may comprise ion implanted areas. In order to obtain these ions implanted areas, the surface of the substrate may be subjected to localised ionic bombardment providing for introduction of numerous point defects in the regular lattice structure of the crystalline substrate. There is observed, in the bombarded areas, an increase in the propagation velocity of the elastic surface waves. On implanting light ions in quartz, the increase in the propagation velocity ($\Delta V/V$) may readily attain 1%, thus entraining acoustic impedance $\Gamma$ V mismatches of the order of 0.5%. A hatched reflective element 3 in FIG. 1 may therefore exhibit a reflection coefficient of the order of 0.5% relative to elastic surface waves emitted by the transducer 5, 6. On considering as a whole the periodic structure the reflective elements 3 of which indicate a localised change of state of the substrate 1, it will be perceived that the propagation of the elastic surface waves is impossible in the frequency bands known as "stop" bands. One of the said "stop" bands is centred on the Bragg frequency, for which the reflections on the reflective elements 3 of the grating afford reflected radiations in phase concordance. This frequency corresponds to a wavelength equal to twice the pitch of the grating.

Due to the presence of the grating of reflective elements 3, the electrical characteristics of the electro-mechanical transducer 5, 6 are completely modified in the "stop" band of the grating.

Figure 2:
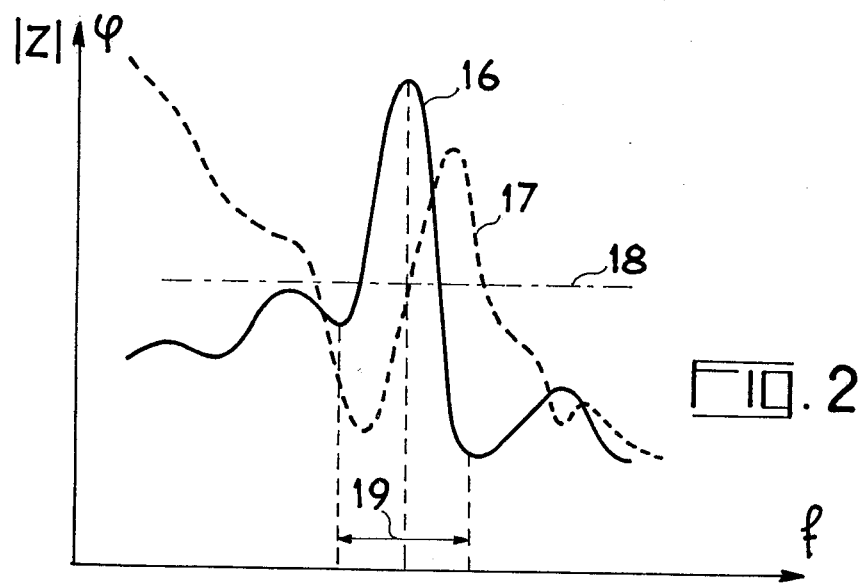
FIG. 2 illustrates the electrical characteristics of the resonator of FIG. 1.

FIG. 2 shows the variation of the modulus |Z| of electrical impedance of the transducer as a function of the frequency f. This variation of |Z| is represented by the curve 16 which exhibits a resonance point in the "stop" band 19. The variation of the phase angle φ is also represented in FIG. 2 by a dotted-line curve the zero ordinate of which corresponds to the reference line 18.

For clarity in the drawings, FIG. 1 shows an extremely small number of the grating lines 3 spaced by a half wavelength. In practice, for resonance frequencies approaching substantially 100 megacycles per second, the grating may comprise a plurality of hundreds of lines, thereby to obtain highly effective wave propagation blocking effect.

Referring to the example shown in FIG. 1, the electrodes 5 and 6 constituting the two transducer combs have their teeth interdigitated with the lines 3 of the grating. This configuration is in no way limitative, since it is possible to provide lines 3 the width of which is at least equal to a quarter wavelength, and the combs 5 and 6 may be disposed on the network in such manner that their teeth straddle the gaps separating the lines 3. The partial section of FIG. 1 shows that the lines 3 are quartz areas distorted by ionic bombardment and which just contact the surface 2 of the substrate 1, penetrating only slightly below the surface.

Without departing from the scope of the invention, the lines 3 could also constitute an embossed grating. In this case, after having effected the ionic bombardment, the surface 2 is subjected to selective chemical etching. A relief is hallowed due to the varying velocities of chemical etching observed in the implanted areas and in the others which have preserved their crystalline structure intact. Finally, the lines 3 may be equally well formed by grooves or by implanted zones. In order to be entirely specific, in the case of quartz, the chemical attack may be effected by means of hydrofluoric acid. Which regard to their shape, the lines 3 are rectilinear in FIG. 1, since the wavefronts issuing from a rectilinear toothed transducer are also rectilinear. More generally speaking, the lines 3 of the grating have a shape such that they are capable of being superposed on the wavefronts which reach them.

The resonator shown in FIG. 1 has a resonance peak the amplitude and fineness of which are relatively moderate. In order to accentuate the amplitude of this resonance peak and to render it finer, the invention provides for the formation of a resonant cavity by separating the grating of reflective elements 3 into two arrays.

FIG. 3 shows such a resonance cavity of length L, the mirrors of which are constituted by two gratings of reflective elements 7 and 8. To form a resonator, an electro-mechanical transducer 5, 6 is introduced into the cavity at a location at which the standing waves developing therein afford a maximum of electrical impedance measured across the terminals A and B. With this structure, it will be appreciated that in the "stop" band of the gratings 7 and 8, the latter behave like mirrors. Experiment has shown that these mirrors may have reflection coefficients capable of exceeding 50%. This type of resonant cavity structure permits the achievement of an extremely fine resonance peak the width of which (at 3 dB) may be of the order of 0.03%, with a resonance frequency of 75 megacycles per second. At resonance, the electric impedance module |Z| may attain several times the value which it would have without cavity effect.

Hitherto, the devices considered function in dipole arrangement and are intended to form part of the composition of electrical filtering networks and oscillator circuits.

FIG. 4 shows the structure of an elastic surface wave filter functioning as a quadripole between a pair of input terminals A, B and a pair of output terminals. In this embodiment, the principle of the resonant cavity has been retained, but the electro-mechanical transducer is divided into two elements disposed externally of the resonant cavity. In fact, referring to FIG. 4, this figure shows a launching transducer 5, 6 electrically connected across the input terminals A and B, and a receiving or collecting transducer 11, 12 connected across the output terminals C and D.

Connected between the transducers 5, 6 and 11, 12 are three successive resonance cavities which are delimited by the succession of selective reflection gratings 7, 8, 9 and 10. The lengths $L_1$, $L_2$ and $L_3$ of the cavities are differentiated, in order that the resonance peaks may be frequency staggered.

The device of FIG. 4 behaves in the manner of a band pass filter since, in the stop band of the gratings 7, 8, 9 and 10, there are transmission ranges corresponding to the resonance frequencies of the cavities.

The transmission coefficient of a cavity attains its maximum when its length L corresponds to an uneven number of quarter wavelength. Depending on whether the lengths $L_1$, $L_2$ and $L_3$ have values close to or remote from each other, it is possible to obtain a single overall pass-band or three separate pass-bands. Of course, the filter of FIG. 4 may function with a single resonance cavity, if for example the gratings 9 and 10 are omitted.

The filter of FIG. 4 has the drawback that, apart from the "stop" band of the selective reflection gratings, there is a good coefficient of transmission for the elastic surface waves exchanged by the transducers 5, 6 and 11, 12.

In order to palliate this drawback, it is possible to adopt the configuration of FIG. 5. The launching transducer 5, 6 radiates in a first direction 14 towards a selective reflection grating 13. The fraction of vibratory energy reflected by the grating 13 progresses in a further direction 15 towards the receiving or collecting transducer 11, 12. Between the grating 13 and the transducer 11, 12, there is interposed a resonant cavity of length L, the mirrors of which are constituted by two selective reflection gratings 7 and 8 having substantially the same "stop" band as the grating 13. In view of the presence of the grating 13, the cavity 7, 8 receives only the rays situated in the "stop" band, since externally of this band the surface waves emitted by the transducer 5, 6 are transmitted without undergoing reflection on the grating 13.

The selective-reflection devices of the preceding Figs. are multiple-wave, interferential devices.

Figure 6:
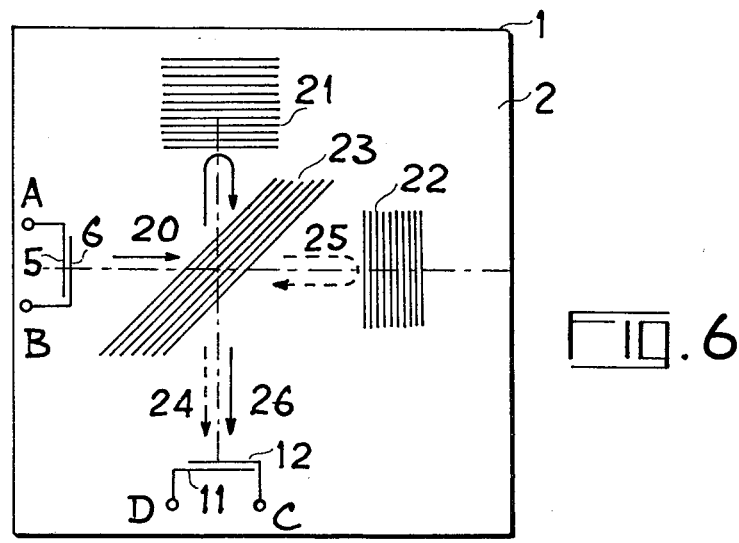
FIG. 6 shows a two waves interferometric device.

Referring to FIG. 6, there may be seen an interferometric device of the two-wave type. It comprises, at the surface 2 of the substrate 1, an electro-mechanical launching transducer 5, 6 radiating elastic surface waves 20 towards an oblique, selective reflection grating 23. A fraction of the incident vibratory energy is reflected by the grating 23 in the direction of a second selective reflection grating 21 which despatches it in the direction of the arrows shown in full line 26 and passing through the grating 23, towards an electro-mechanical receiving transducer 11, 12. The other fraction of the vibratory energy incident on the grating 23 is transmitted towards a third selective reflection grating 22 which transmits it in the direction of the arrows shown in dotted line 25 and 24 towards the transducer 11, 12 after it has undergone a second reflection on the grating 23.

In the "stop" band of the gratings 21, 22, 23, the energy obtained there from the transducer 5, 6 is transmitted along two separate paths towards the transducer 11, 12. The two energy fractions received by the transducer 11, 12 are able to interfere and give rise to a transfer function the profile of which recalls that of the interference fringes observed in optical systems such as interferometers of the Michelson type.

Figure 7:
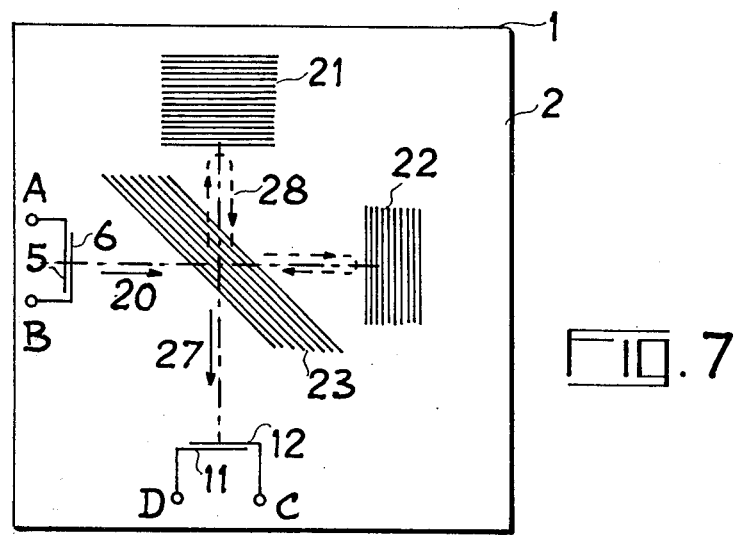
FIG. 7 shows a multiple waves interferometric device comprising a resonant cavity.

In FIG. 7 there may be seen a structure similar to that of FIG. 6 but constituting a multiple-wave interferential device. The only modification resides in the change in orientation imparted to the grating 23. FIG. 7 shows that the grating 23 cooperates with the gratings 21 and 22 in such manner as to form a resonant cavity at which may be established a standing wave region represented by the dotted-line trace 28. The grating 23 also acts as an oblique reflector receiving the vibratory energy 20 emitted by the transducer 5, 6 and transmitting it partially in the direction 27 towards the transducer 11, 12. The reflective power of the grating 23 is influenced by the cavity effect and the result thereof is a mode of functioning analogous to that of the device shown in FIG. 5.

In the foregoing examples, there have been selected elastic surface waves having rectilinear wavefronts, in such manner that the lines of the selective reflection gratings are also rectilinear. According to the invention, it is also possible to manufacture resonator or resonant cavity in which the lines of the selective reflection gratings mate the shape of non-rectilinear wavefronts.

Figure 8:
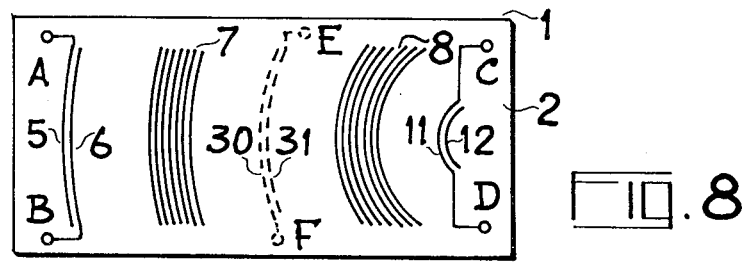
FIG. 8 shows variants of a resonant cavity filter and of a resonator.

In FIG. 8, there is shown a resonant cavity the mirrors of which are constituted by gratings 7 and 8 having inwardly curved lines. The transducers 5, 6 and 11, 12 also have inwardly curved teeth and are capable of radiating waves the wavefronts of which are superposable on the lines of the gratings 7 and 8. By suppressing the transducers 5, 6 and 11, 12 and introducing the cavities 7, 8 a transducer 30, 31 having inwardly curved teeth (shown in dotted line in FIG. 8), it becomes possible to pass from band-pass filter functioning to resonator functioning.

What I claim is:

1. A surface wave electromechanical device comprising a crystalline substrate having a face for propagating surface wave vibratory energy, at least one electromechanical transducer positioned on said face for radiating said surface wave vibratory energy, and surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electro-mechanical transducer, and separated from one another by a half wavelenght.

2. A device as claimed in claim 1, wherein said reflective elements form an embossed pattern within said face.

3. A surface wave electromechanical device comprising a crystalline substrate having a face for propagating surface wave vibratory energy, at least one electromechanical transducer positioned on said face for radiating said surface wave vibratory energy, and surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electromechanical transducer, and separated from one another by a half wavelength; said reflective elements forming an embossed pattern within said face, and said ion implanted areas being subjected to chemical etching giving rise to said embossed pattern.

4. A surface wave electromechanical resonator device comprising a crystalline substrate having a face for propagating surface wave vibratory energy, at least one electromechanical transducer positioned on said face for radiating said surface wave vibratory energy, and surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electromechanical transducer, and separated from one another by a half wavelength; said electromechanical transducer being arranged in the median region of said grating; said electromechanical transducer comprising two interdigitated comb shaped electrodes deposited on said face; said substrate being cut from a piezoelectric material; the teeth of said comb shaped electrodes being positioned along the gaps separating from one another said reflective elements.

5. A device as claimed in claim 1, wherein, for forming a resonator element, said electromechanical transducer is situated within a resonant cavity delimited by two gratings of reflective elements; said two gratings acting as mirrors; said electromechanical transducer comprising two interdigitated comb shaped electrodes deposited on said face; said substrate being cut from a piezo-electric material.

6. A device as claimed in claim 1, wherein, for forming an interferential filter, said device comprises: two electro-mechanical transducers arranged on said face for exchanging said surface wave vibratory energy; said device further comprising at least one resonant cavity interposed between the said electromechanical transducers; said cavity being delimited by two gratings of reflective elements; said two gratings acting as mirrors; said electromechanical transducers each comprising two interdigitated comb shaped electrodes deposited on said face; said substrate being cut from a piezo-electric material.

7. A surface wave electromechanical device comprising a crystalline substrate having a face for propagating surface wave vibratory energy, at least one electromechanical transducer positioned on said face for radiating said surface wave vibratory energy, and surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electromechanical transducer, and separated from one another by a half wavelength; said device forming an interferential filter comprising: two electromechanical transducers arranged on said face for exchanging said surface wave vibratory energy; said device further comprising at least one resonant cavity interposed between the said electromechanical transducers; said cavity being delimited by two gratings of reflective elements; said two gratings acting as mirrors; said electromechanical transducers each comprising two interdigitated comb shaped electrodes deposited on said face; said substrate being cut from a piezoelectric material; a further grating of reflective elements being arranged in said face for obliquely reflecting said surface wave vibratory energy; said further grating being interposed on the path comprised between said cavity and one of said electromechanical transducers.

8. A surface wave electromechanical device comprising a crystalline substrate having a face for propagating surface wave vibratory energy, at least one electromechanical transducer positioned on said face for radiating said surface wave vibratory energy, said surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electromechanical transducer, and separated from one another by a half wavelength; two electromechanical transducers being arranged on said face; said electromechanical transducers having directions of radiation at an angle with one another; a first grating of reflective elements being oriented substantially in accordance with one of the bissectrices of said directions and located at the point of intersection of said directions; second and third gratings of reflective elements being respectively arranged for reflecting the fractions of said surface wave vibratory energy emerging in the said directions from said first grating; said electro-mechanical transducers each being constituted by two interdigited comb shaped electrodes; said substrate being cut from a piezo-electric material.

9. A device as claimed in claim 8, wherein the orientation of the said first grating is selected for building up a two-wave interferometric system.

10. A device as claimed in claim 9, wherein the orientation of the said first grating is selected for building up a multiple wave interferometric system.

11. A device as claimed in claim 1, wherein said reflective elements are rectilinear.

12. A surface wave electromechanical device comprising a crystalline substrate having a face for propagating surface wave vibratory energy, at least one electromechanical transducer positioned on said face for radiating said surface wave vibratory energy, said surface wave selectively reflecting means arranged in said face for receiving said surface wave vibratory energy; said surface wave selectively reflecting means comprising at least one grating of reflective elements causing along the propagation path of said surface wave vibrating energy a periodic physical modification of the propagation characteristics of said crystalline substrate; said periodic physical modification arising from the creation in said face of ion implanted areas wherein numerous point defects are introduced in the regular lattice structure of said crystalline substrate; said reflective elements forming a pattern coinciding with a pattern of surface wave wavefronts launched by said electromechanical transducer, and separated from one another by a half wavelength; said reflective elements being curvilinear.

* * * * *